United States Patent
Saito et al.

(10) Patent No.: US 7,221,614 B2
(45) Date of Patent: May 22, 2007

(54) STACKED SEMICONDUCTOR MEMORY DEVICE

(75) Inventors: Hideaki Saito, Tokyo (JP); Yasuhiko Hagihara, Tokyo (JP); Muneo Fukaishi, Tokyo (JP); Masayuki Mizuno, Tokyo (JP); Hiroaki Ikeda, Tokyo (JP); Kayoko Shibata, Tokyo (JP)

(73) Assignees: NEC Corporation, Tokyo (JP); Elpida Memory, Inc., Tokyo (JP)

( * ) Notice: Subject to any disclaimer, the term of this patent is extended or adjusted under 35 U.S.C. 154(b) by 112 days.

(21) Appl. No.: 11/151,220

(22) Filed: Jun. 14, 2005

(65) Prior Publication Data

US 2005/0285174 A1    Dec. 29, 2005

(30) Foreign Application Priority Data

Jun. 28, 2004    (JP)    ............................ 2004-190317

(51) Int. Cl.
*G11C 5/00*    (2006.01)
(52) U.S. Cl. ...................... 365/230.03; 365/51; 365/63
(58) Field of Classification Search ..................... None
See application file for complete search history.

(56) References Cited

U.S. PATENT DOCUMENTS 4,398,248 A * 8/1983 Hsia et al. ............. 365/230.03
6,487,102 B1 * 11/2002 Halbert et al. ................ 365/51
6,594,169 B2 * 7/2003 Sakui ........................... 365/51
7,099,173 B2 * 8/2006 Koide ........................... 365/51

FOREIGN PATENT DOCUMENTS

| JP | 04-196263 | 7/1992 |
|----|-----------|--------|
| JP | 2001-035152 | 2/2001 |
| JP | 2002-026283 | 1/2002 |
| JP | 2003-204030 | 7/2002 |
| JP | 2003-209222 | 7/2003 |
| JP | 2004-102781 | 4/2004 |

* cited by examiner

*Primary Examiner*—Tan T. Nguyen
(74) *Attorney, Agent, or Firm*—Dickstein Shapiro LLP

(57) ABSTRACT

The stacked semiconductor memory device of the present invention has the object of reducing the cost of developing a wide variety of memory devices and includes: a memory cell array chip that is equipped with memory cell arrays, an interface chip that is stacked with the memory cell array chip and that is provided with a memory configuration switching circuit for changing the input/output bit configuration of the memory cell arrays, and a plurality of interchip wires for connecting the memory cell array chip and the interface chip.

20 Claims, 13 Drawing Sheets

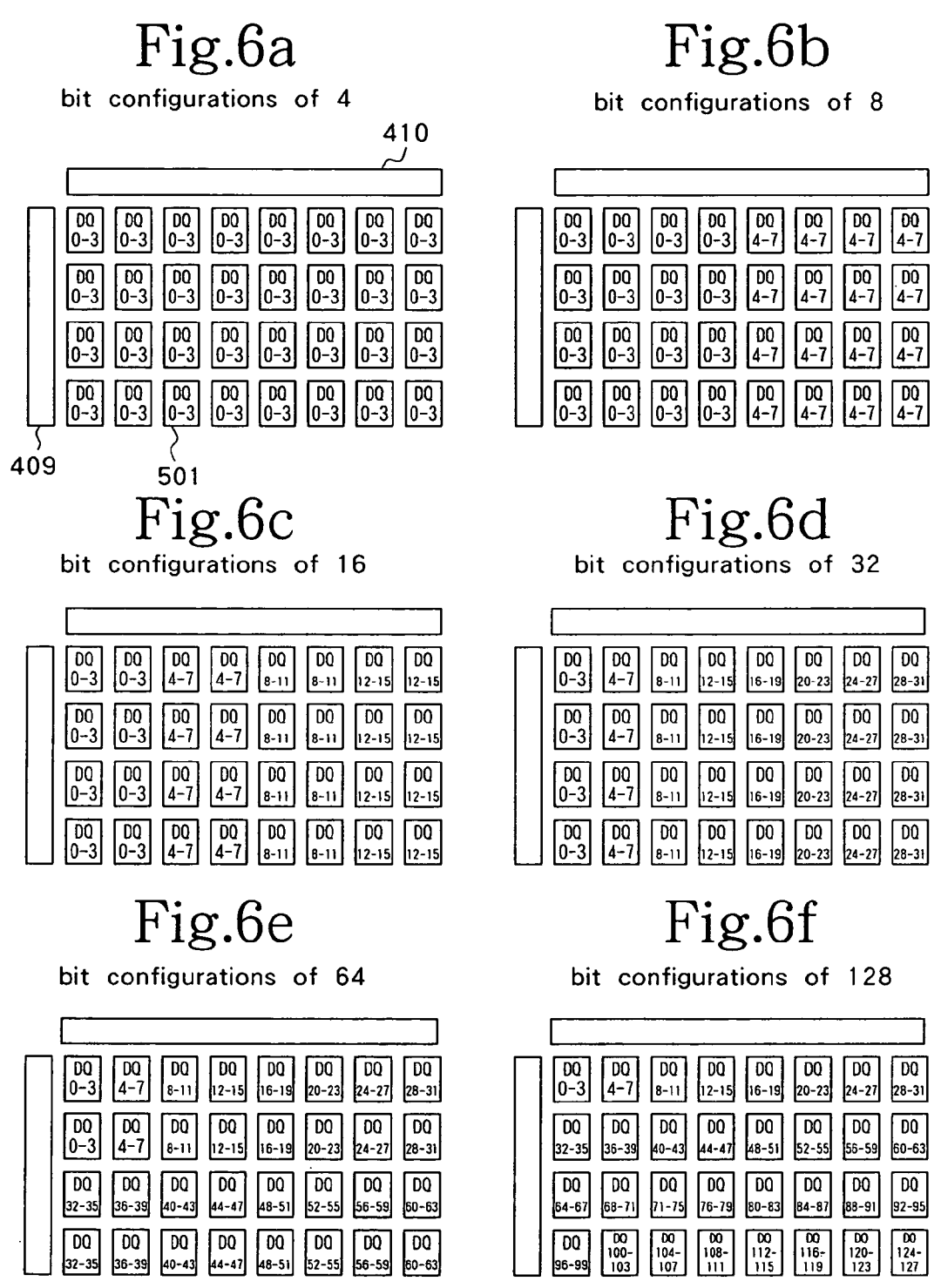

Fig.6a
bit configurations of 4

Fig.6b
bit configurations of 8

Fig.6c
bit configurations of 16

Fig.6d
bit configurations of 32

Fig.6e
bit configurations of 64

Fig.6f
bit configurations of 128

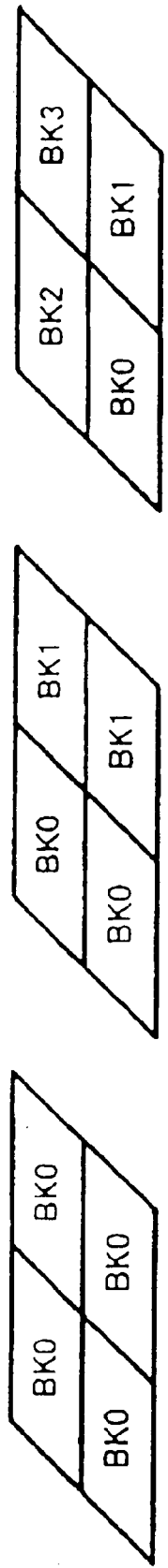

Fig.11

|  | 4bit | 8bit | 16bit | 32bit | 64bit | 128bit | 256bit | 512bit |
|---|---|---|---|---|---|---|---|---|
| 1bank | 128M | 64M | 32M | 16M | 8M | 4M | 2M | 1M |
| 2banks | 64M | 32M | 16M | 8M | 4M | 2M | 1M | |
| 4banks | 32M | 16M | 8M | 4M | 2M | 1M | | |

STACKED SEMICONDUCTOR MEMORY DEVICE

BACKGROUND OF THE INVENTION

1. Field of the Invention

The present invention relates to a semiconductor memory device, and more particularly to a semiconductor memory device in which a memory cell array chip and an interface chip for changing the memory configuration are stacked.

2. Description of the Related Art

With the miniaturization and increased integration of semiconductor integrated circuits, DRAM (Dynamic Random Access Memory) and SRAM (Static Random Access Memory) have achieved memory having greatly increased capacity. However, the miniaturization of semiconductors has limits, and there is consequently a need for the introduction of new techniques for achieving greater increases in capacity.

A three-dimensional semiconductor in which semiconductor chips are stacked has been proposed as one technique for achieving greater capacity. Japanese Patent Laid-Open Publication No. H04-196263 discloses the realization of a large-scale integrated circuit in which semiconductor chips are stacked without changing the chip area. In this circuit, a memory circuit is integrated on a separate chip that is stacked on the main semiconductor integrated circuit. Japanese Patent Laid-Open Publication No. 2002-26283 and Japanese Patent Laid-Open Publication No. 2003-209222 disclose multilayer memory structures in which memory cell arrays are realized with multiple layers to achieve even greater increases in capacity.

In the invention that is described in Japanese Patent Laid-Open Publication No. 2002-026283, memory peripheral circuits are not provided for each memory chip of a multilayered memory chip, but rather, each of the memory chips shares one pair of peripheral circuits to realize a reduction in the area of the peripheral circuits that occupy the chip area.

In the invention that is described in Japanese Patent Laid-Open Publication No. 2003-209222, memory layers can be sorted following fabrication of a multilayered memory device to enable elimination of defective memory layers.

However, although each of the above-described multilayered memory devices enables an increase in memory capacity within a limited chip area, no disclosure is made regarding the number of input/output bits and the number of banks, which are constituent elements of the memory, or regarding the data transfer rate.

On the other hand, the increased performance of the CPU, that accompanies memory, calls for not only greater capacity of the memory device, but also for an increase in the input/output bits, an increase in the number of banks, and a higher memory transfer rate. The diversification of systems has resulted in a wide variety of memory configurations, and as a result, many varieties of memory devices must be developed, and the cost of developing these memory devices grows with each year.

SUMMARY OF THE INVENTION

The present invention was achieved in order to address factors and has as its object a stacked semiconductor memory device in which memory cell arrays and circuits for changing the memory cell arrays are stacked on separate chips, and the chips then interconnected using a multiplicity of wires having little delay; this stacked semiconductor memory device thus enabling a wider range of reconfiguration of the memory configuration, particularly of the input/output bit configuration and the input/output prefetch configuration that relates to the memory transfer rate, and allowing a reduction of the cost of developing a wide variety of memory devices.

The stacked semiconductor memory device of the present invention includes: a memory cell array chip that is provided with a memory cell array; an interface chip that is stacked with the memory cell array chip and that is provided with memory configuration switching circuits for changing the input/output bit configuration of the memory cell array; and a multiplicity of interchip wires for connecting the memory cell array chip and the interface chip.

In this case, a plurality of memory cell array chips may be stacked, and the memory configuration switching circuit may change the input/output bit configurations of the memory cell arrays that are provided on each of the plurality of stacked memory cell array chips.

In addition, the memory configuration switching circuit may include: a plurality of switches that are provided for each group of a prescribed number of the plurality of memory units that make up a memory cell array, wherein the number of input/output bits of each memory unit group changes according to the switched state of these switches; and a bit switching circuit for changing the number of input/output bits of the corresponding memory unit group by switching the switched state of the plurality of switches.

In this case, the memory configuration switching circuits may include: a plurality of latch circuits that are each connected to a respective one of a plurality of data buses for latching the data in each data bus, input and output of input/output data of the plurality of memory unit groups passing via these data buses; and a control circuit for controlling the number of bits of input/output data and the transfer rate by controlling the latch timing in the plurality of latch circuits.

In addition, the control circuit may change the number of input/output bits of the memory unit groups by way of the bit switching circuits, and may implement control such that the number of input/output bits of the memory unit groups is equal to the number of bits of input/output data.

In addition, the control circuit may be equipped with fuses that are provided in the wires, and according to the cut state of these fuses, may generate signals for controlling the number of input/output bits of the memory unit groups, or may control the number of bits of input/output data and the transfer rate.

In addition, the control circuit may be a logic circuit that operates in accordance with the combination of bonding option input signals, and may generate signals that control the number of input/output bits of the memory unit groups or the number of bits of input/output data and the transfer rate. The stacked semiconductor memory device according to any of the above descriptions may be DRAM.

According to the present invention, in a memory device in which memory cell array chips and interface chips are stacked, the input/output bit configuration of the memory cell array chips and the data transfer rate are changed by the memory configuration switching circuits of the interface chips. In this way, the cost of developing a wide variety of memory devices can be reduced.

BRIEF DESCRIPTION OF THE DRAWINGS

FIG. 3 shows the switching means of the input/output bit configuration,

FIG. 6 shows the bit assignment of a memory cell array,

FIG. 6a showing a 4-bit configuration,

FIG. 6b showing an 8-bit configuration,

FIG. 6c showing a 16-bit configuration,

FIG. 6d showing a 32-bit configuration,

FIG. 6e showing a 64-bit configuration, and

FIG. 6f showing a 128-bit configuration;

FIG. 9 shows the rearrangement of wires realized by switching operations,

FIG. 10 is a conceptual view of the assignment of banks of a memory cell array chip;

FIG. 11 shows the number of words that correspond to configurations of a number of bits and a number of banks of a 512-Mb DRAM;

DETAILED DESCRIPTION OF THE PREFERRED EMBODIMENTS

Explanation next regards working examples of the present invention with reference to the accompanying figures.

Figure 1:
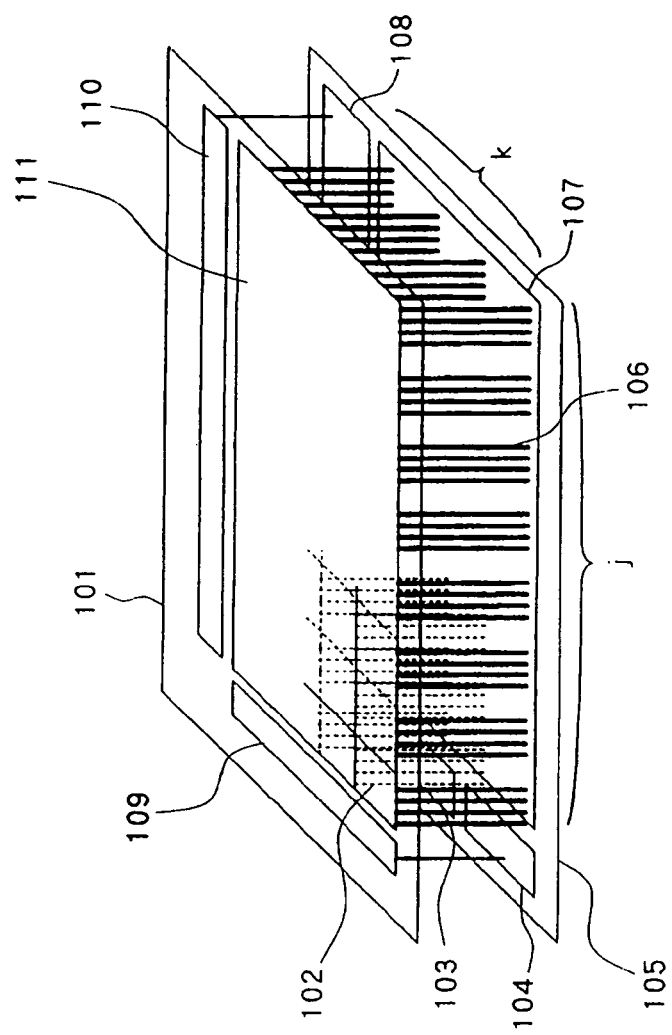
FIG. 1 shows the configuration of a stacked memory device.

FIG. 1 is a schematic view of the configuration of a working example of the stacked memory device according to the present invention.

As shown in FIG. 1, the present working example is made up of: memory cell array chip 101, memory unit 102, input/output buffer 103, address buffer 104, interface chip 105, interchip wires 106, memory configuration switching circuit 107, address buffer 108, row decoder 109, column decoder 110, and memory cell array 111.

Memory cell array 111 is made up from a plurality of memory units 102 that are arranged in a matrix; this matrix being integrated with row decoder 109 and column decoder 110 to make up memory cell array chip 101. Interface chip 105 is made up of address buffer 104, input/output buffer 103, and memory configuration switching circuit 107; is stacked with memory cell array chip 101; and is connected to memory cell array chip 101 by interchip wires 106.

Figure 2:
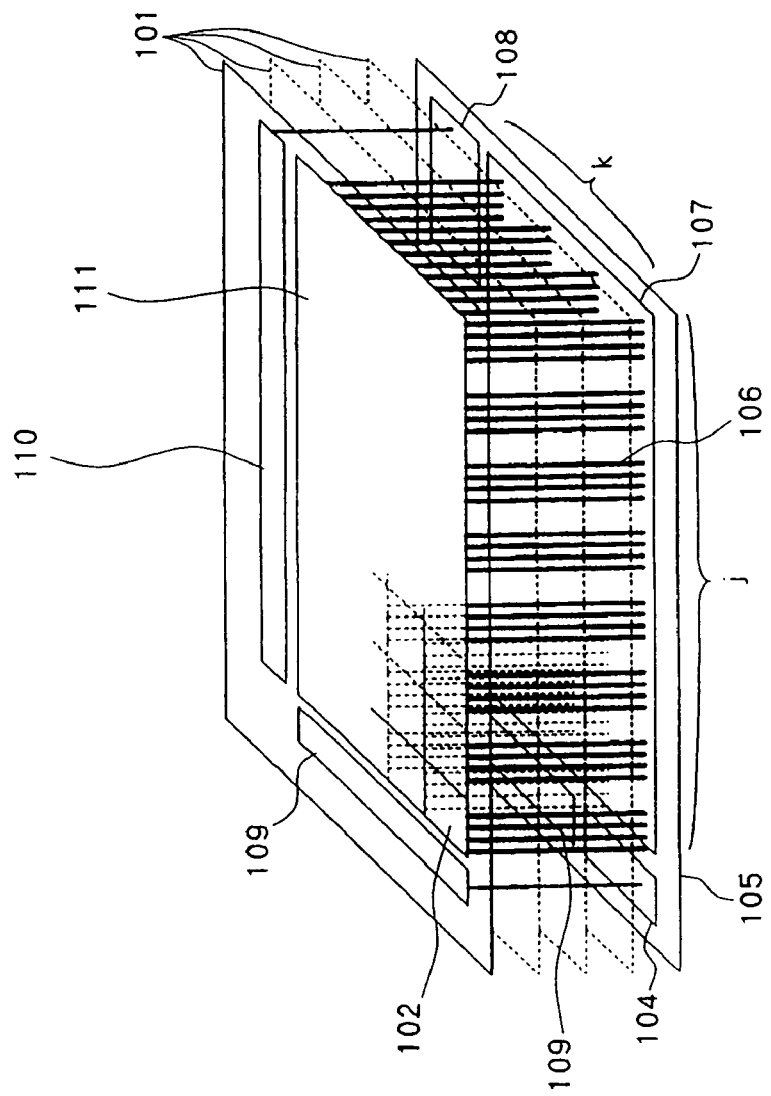
FIG. 2 shows the configuration of a multilayered stacked memory device.

Memory cell array 111 of memory cell array chip 101 and memory configuration switching circuit 107 of interface chip 105, taking advantage of the stacked structure, are connected by the multiplicity j×k of interchip wires 106 to enable highly parallel data transmission. Due to the stacked configuration, the chip area is smaller than for a memory device of the same capacity having a planar configuration of the prior art. In addition, stacking a plurality of memory cell array chips 101 as shown in FIG. 2 allows a further increase in area efficiency.

Explanation next regards the means for switching the input/output bit configuration of the memory device. Memory cell array 111 is made up of n memory units 102. Memory cell array 111 is connected to memory configuration switching circuit 107 by a data bus of four bits (DQ0, DQ1, DQ2, DQ3) that is made up of four interchip wires 106 from each memory unit 102, the total number of bits of the data buses being 4n.

Figure 3A:
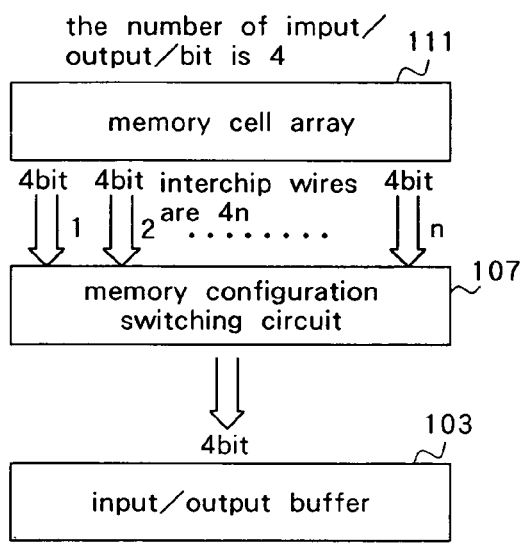
FIG. 3a showing a 4-bit configuration.
Figure 3B:
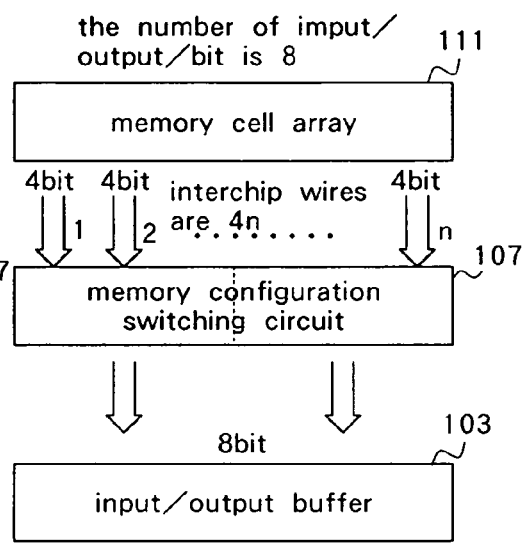
FIG. 3b showing an 8-bit configuration.
Figure 3C:
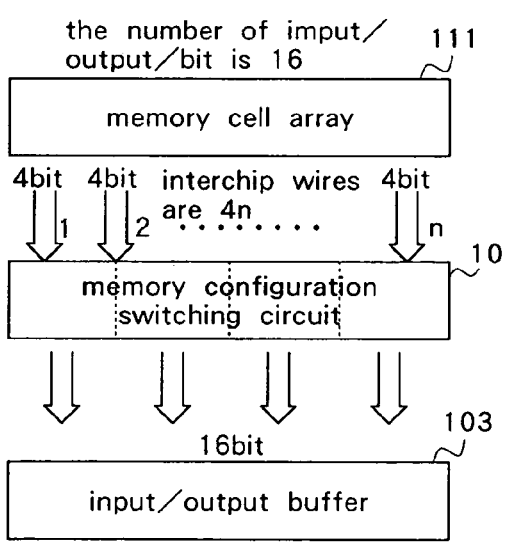
FIG. 3c showing a 16-bit configuration.
Figure 3D:
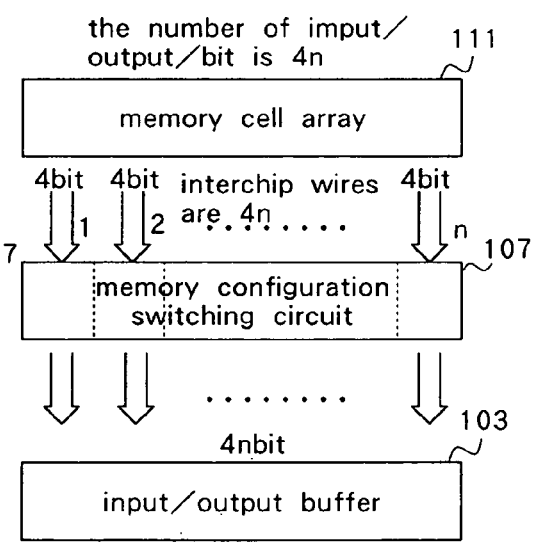
FIG. 3d showing a 4n-bit configuration.

If the data buses from all n memory units are organized by DQ by means of memory configuration switching circuit 107 as shown in FIG. 3a, the number of input/output bits is 4. Arranging the data buses from n/2 memory units as shown in FIG. 3b results in eight input/output bits, arranging the data buses from n/4 memory units as shown in FIG. 3c results in 16 input/output bits, and if the data buses from n memory units are connected in parallel to the input/output buffer without alteration, 4n-bit input/output configuration is realized as shown in FIG. 3d.

As described in the foregoing explanation, switching the data bus wires between chips having a large parallel number, by means of memory configuration switching circuit 107 on interface chip 105, enables switching of the input/output bit configuration of the memory device over a wide range from a 4-bit to a 4n-bit configuration on one memory cell array chip 101.

In addition, providing latches on the data buses of memory configuration switching circuit 107 in interface chip 105, prefetching data, and then controlling the timing of clocks to the latches enables a doubling or a quadrupling of the data transfer rate with an external interface without changing the clock frequency of memory cell array 111.

Explanation next regards the details of a working example of the present invention with reference to the accompanying figures.

Figure 4:
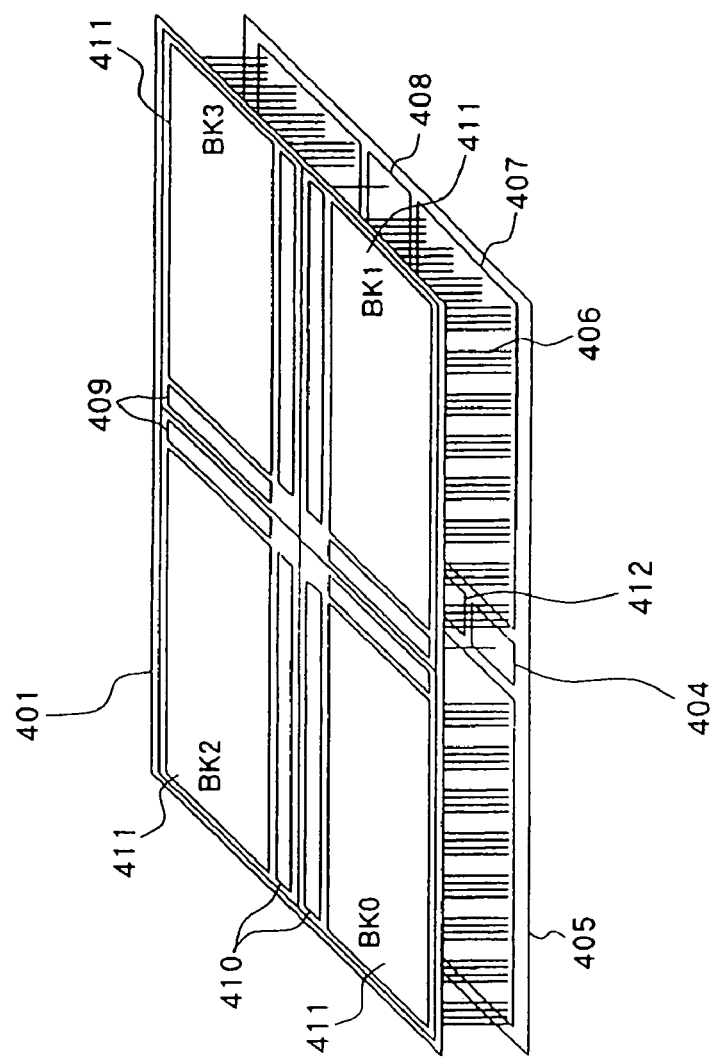
FIG. 4 shows a 512-Mb stacked DRAM device for explaining a working example of the present invention.

FIG. 4 shows the configuration of a working example of a 512-Mb stacked DRAM device according to the present invention. In FIG. 4, memory cell array chip 401, memory units 402, input/output buffer 403, address buffer 404, interface chip 405, interchip wires 406, memory configuration switching circuit 407, address buffer 408, row decoder 409, column decoder 410, and memory cell arrays 411 are each equivalent to memory cell array chip 101, memory unit 102, input/output buffer 103, address buffer 104, interface chip 105, interchip wires 106, memory configuration switching circuit 107, address buffer 108, row decoder 109, column decoder 110, and memory cell array 111, respectively, that are shown in FIG. 1.

Memory cell array chip 401 is stacked on interface chip 405. Memory cell array chip 401 has a four-bank configuration (BK0, BK1, BK2, BK3), each bank being provided with 128-Mb memory cell array 411, row decoder 409, and column decoder 410. Interface chip 405 is provided with memory configuration switching circuit 407, address buffer 404, and input/output buffer 403. Memory cell array 411 of memory cell array chip 401 and memory configuration switching circuit 407 of interface chip 405 are connected by data buses, and row decoder 409 and column decoder 410 are connected to address buffer 404 by an address bus. Each of these buses employs interchip wires 406, which are through-type wires having an extremely short distance of 100 µm or less that pass through the chip; and these data buses, due to their large diameter in the order of 20 µm and low resistance, enable high-speed transfer in the GHz order.

Figure 5A:
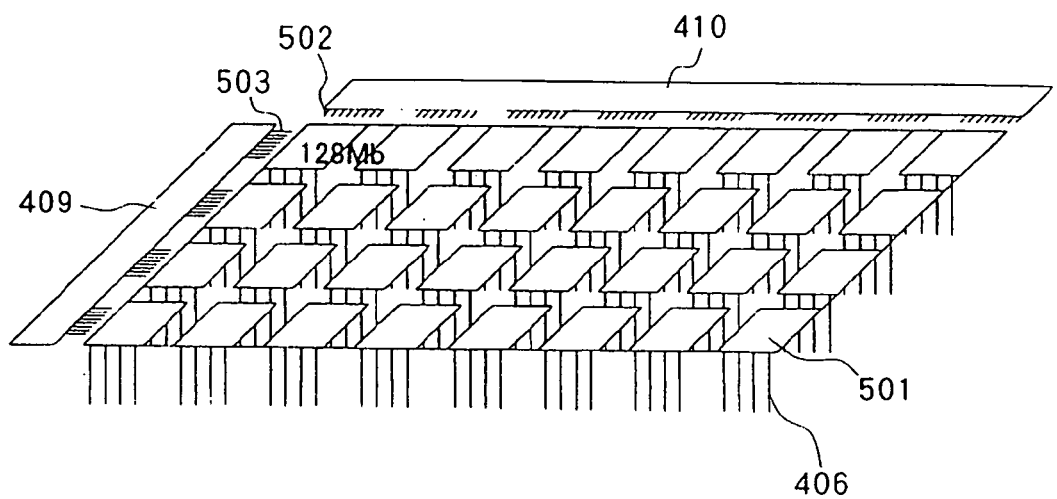
FIG. 5a shows the banks of a DRAM memory cell array.
Figure 5B:
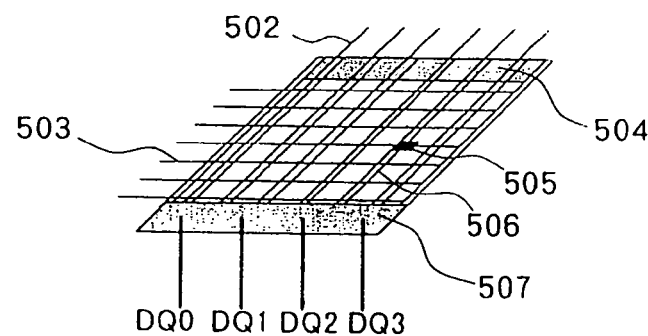
FIG. 5b shows a 4-Mb memory unit.

FIG. 5 presents a detailed view of memory cell array 411, FIG. 5a showing the details of the bank portion, and FIG. 5b showing the internal configuration. 128-Mb memory cell array 411 is made up of 32 4-Mb memory units 501. Four interchip wires 406 extend from each 4-Mb memory unit 501, these interchip wires 406 constituting 4-bit data buses. 4-Mb memory unit 501 has a 4-bit 1-Mword configuration, and as shown in FIG. 5b, regarding the internal configuration of 4-Mb memory unit 501, 1024 data select lines 502 from column decoder 410 and 1024 word lines 503 from row decoder 409 connect with the memory unit, and memory cells 505 exist at the four DQ portions DQ0, DQ1, DQ2, and DQ3 at the intersections of data select lines 502 and word lines 503.

When reading data, the small-amplitude differential signal of the data line that depends on the data of each memory cell 505 is converted to a full-amplitude signal by sense amplifier 504 and data amplifier 507 and sent to the data buses of the four bits DQ0, DQ1, DQ2, and DQ3. When writing data, data are sent from the four-bit data bus to the four data lines that have been selected at data select lines 502 and the data are written to memory cells 505 of the four DQ portions at the intersections with selected word lines 503. The four-bit data bus exchanges data with interface chip 405 through four interchip wires.

FIG. 6 shows the DQ bit assignment to memory cell array 411 when changing the input/output bit configuration inside banks. Changing the combinations of 128 data bus wires that connect from one bank of memory cell array chip 401 by means of memory configuration switching circuit 407 of interface chip 405 changes the number of input/output bits. Using the 4-Mb memory units of the four DQ as the smallest units, bit configurations of ×4, ×8, ×16, ×32, ×64, and ×128 can be assigned as shown in FIGS. 6a–6f.

Figure 7:
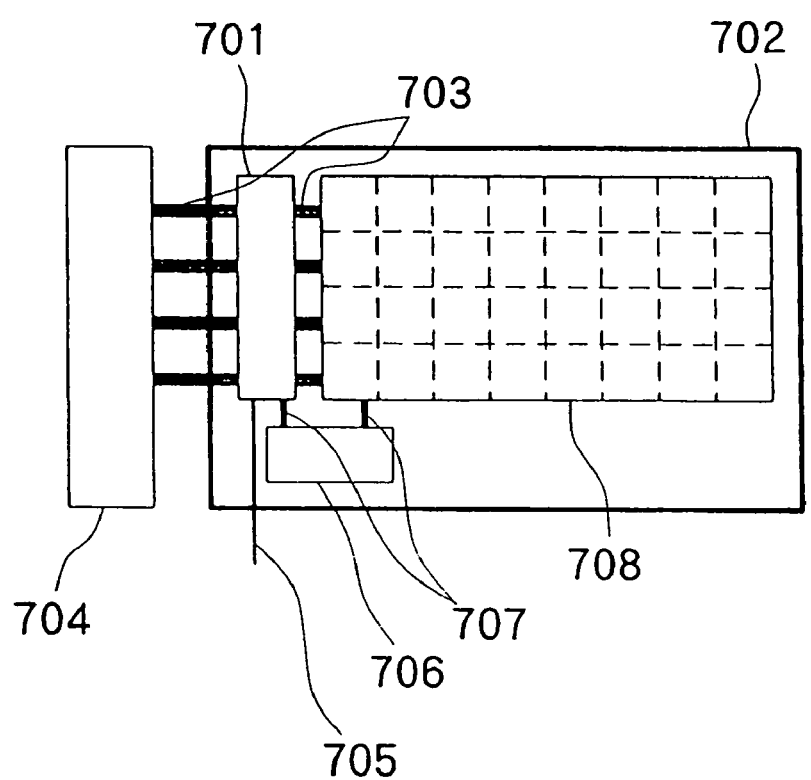
FIG. 7 shows a conceptual view of a memory configuration switching circuit.

FIG. 7 is a block diagram showing the configuration of memory configuration switching circuit 702 of memory interface chip 405. Memory configuration switching circuit 702 is made up from bit-switching circuit 708, prefetch switching circuit 701, and switching control circuit 706. Bit-switching circuit 708 rearranges the data bus lines from memory cell array chip 401.

Figure 8:
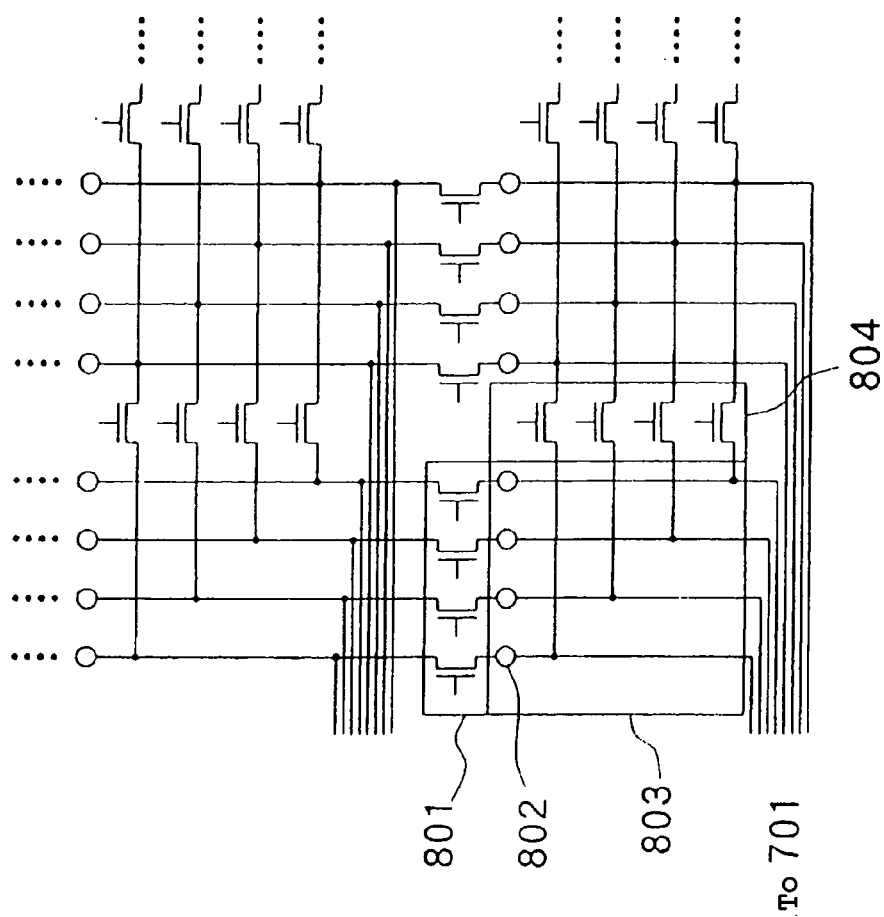
FIG. 8 shows the configuration of a bit switching circuit.

FIG. 8 is a block diagram showing the details of the configuration of bit-switching circuit 708. The four interchip wires 406 that extend from 4-Mb memory unit 501 in memory cell array chip 401 that is shown in FIG. 4 and FIG. 5a are connected to four-bit wiring unit 803 of bit-switching circuit 708 that is shown in FIG. 8, and as with the memory units, these bit-switching circuits 708 are provided in eight horizontal rows and four vertical columns for a total of 32. Connections between each of wiring units 803 are realized by 4-switch arrays 801 and 804 that are made up of the transfer gates of four transistors. In addition, wires from bit-switching circuit 708 are connected to input/output buffer 412 by way of prefetch switching circuit 701.

FIG. 9 shows a portion in which eight 4-bit wiring units 803 are arranged horizontally inside bit-switching circuit 708, wherein the number of bits is switched by switching 4-switch arrays 804 between 4-bit wiring units 803.

Figure 9A:
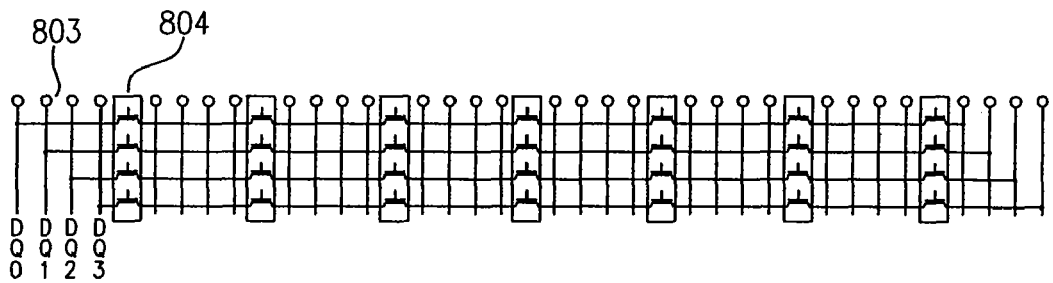
FIG. 9a showing a 4-bit configuration.
Figure 9B:
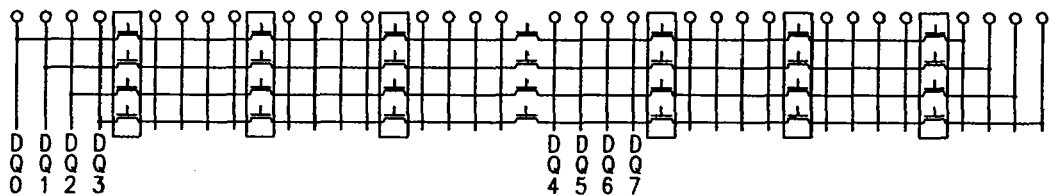
FIG. 9b showing an 8-bit configuration.
Figure 9C:
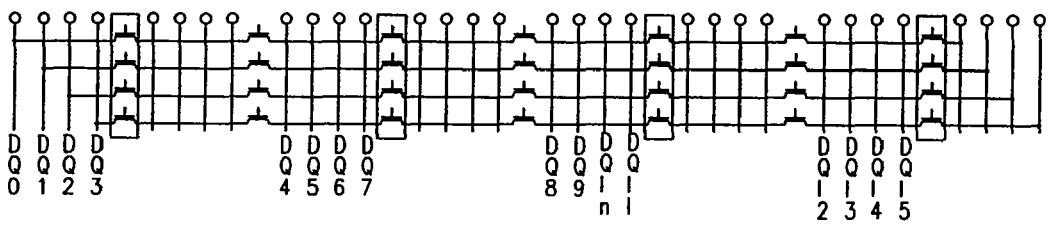
FIG. 9c showing a 16-bit configuration.
Figure 9D:
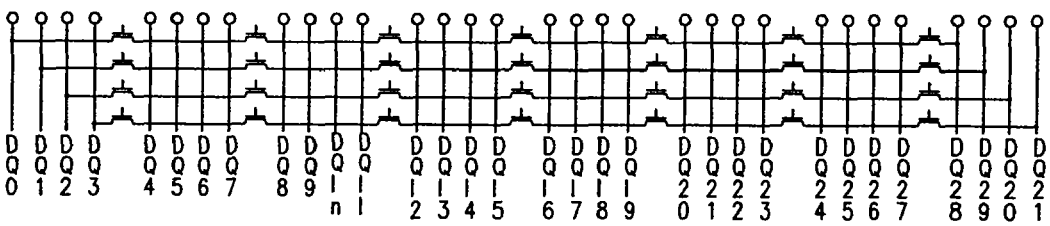
FIG. 9d showing a 32-bit configuration.

Turning ON 4-switch arrays 804 that are enclosed by boxes in FIG. 9 enables setting the bit configurations of ×4, ×8, ×16, and ×32 that are shown in FIGS. 9a–9d. Further connecting the 32-bit configuration that is shown in FIG. 9d to four rows vertically and then switching the interposed switch arrays enables setting the input/output bit configurations of ×32, ×64, and ×128 that correspond to FIGS. 6d–6f.

The switch control signals of bit-switching circuit 708 are sent from switching control circuit 706. As a configuration of a switching control circuit, a configuration can be proposed in which fuses are provided in the wires of switching control circuit 706, the circuit being configured to supply the control signals of switches that realize a desired memory configuration by cutting these fuses in accordance with the specifications of the memory configuration following fabrication of the chip. As an alternative to this configuration, a configuration can also be proposed in which switching control circuit 706 is a logic circuit that operates according to a combination of bonding option input signals, the logic circuit being configured to output the control signals of switches that realize a desired memory configuration by causing bonding between bonding option pads and package pins in accordance with the desired input/output bit configuration specifications when packaging the chip.

Although only one memory cell array chip was shown in the present working example, adopting a form in which a plurality of chips are stacked enables an increase in the memory capacity of the memory device according to the number of chips and allows similar switching of the memory configuration. Further, although a DRAM was used as the memory device in the present working example, a similar configuration is possible using SRAM.

The memory cell array chip allows alteration of the number of banks as one bank, two banks, or four banks as shown in FIG. 10, and when the memory capacity of the memory cell array chip is 512 Mb, 21 types of memory configurations are possible depending on the number of banks and the number of input/output bits as shown in FIG. 11. When a configuration having a plurality of banks is adopted, addresses can be designated in bank units and memory cells then accessed, whereby, when accessing a memory cell in a particular bank, interleaving operations can be carried out in other banks such as precharging, or further, operations for selecting word lines and activating bit lines, and refresh operations. As a result, banks can be accessed successively and without interruption and data transferred.

Explanation next regards a means for, without changing the operating frequency of the memory core, switching the clock timing and prefetch number in prefetch switching circuit 701 and changing the data transfer rate between a memory device and the outside.

Figure 12:
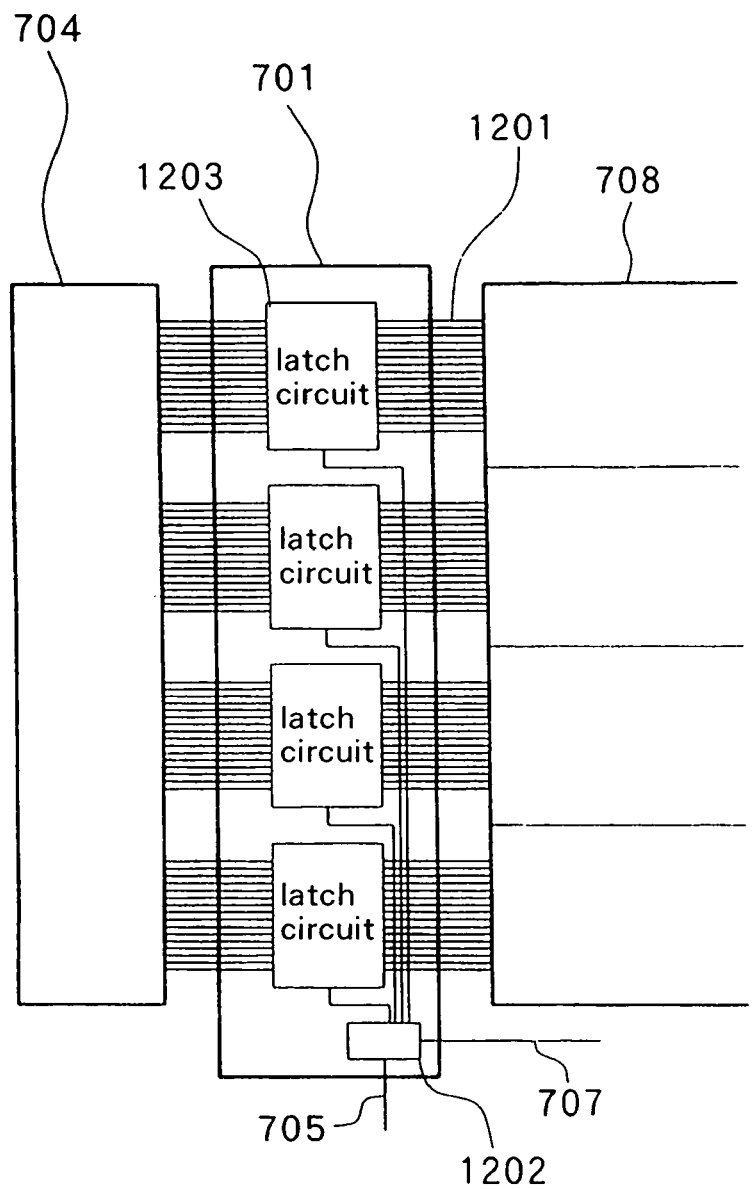
FIG. 12 shows the configuration of a circuit for switching the data transfer rate.

In FIG. 12, data from bit-switching circuit 708 are sent to prefetch switching circuit 701 by way of four sets of 32-bit data buses 1201. Prefetch switching circuit 701 is provided with four latch circuits 1203 that correspond to each of four sets of 32-bit data buses, clock control circuit 1202 is connected to clock line 705 and control signal line 707; prefetch switching circuit 701 regulates clock signals that are sent by way of clock line 705 in accordance with control signals that are sent by way of control signal line 707; and supplies these clock signals to each latch circuit 1203 as the timing signals by which each latch circuit 1203 latches data.

The timing at which data are latched in prefetch switching circuit 701 is controlled, the latched data are sent to input/output buffer 704, and the transfer rate to the outside is switched to double or quadruple the original rate.

Figure 13A:
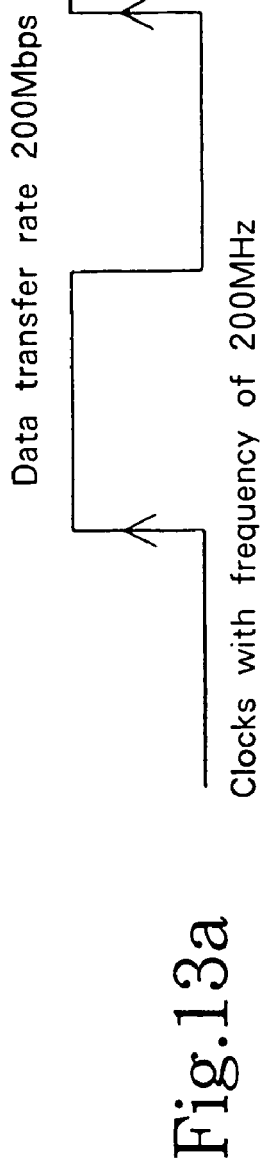
FIG. 13 shows the clock waveforms that are applied as input to a latch when switching the data transfer rate.
Figure 13B:
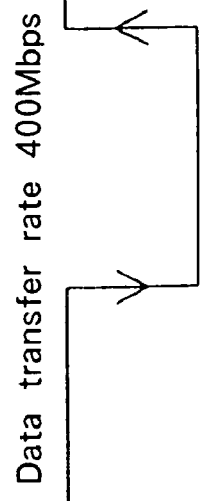
Figure 13C:
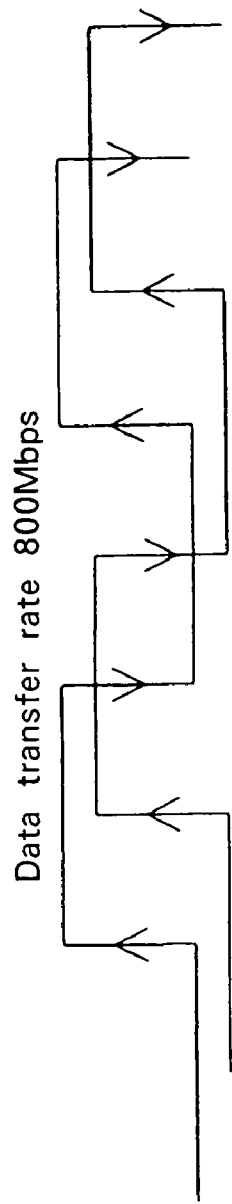

When clocks with a frequency of 200 MHz, which is the same as the clock frequency of memory cell array chip 401, are supplied as input to latches and all of the data of the four sets of 32-bit data buses 1201 are sent to input/output buffer 704 at the rise time of the clocks as shown by the clock waveform in FIG. 13a, the input/output data transfer rate reaches 200 Mbps at 128 input/output bits. When two sets of the four sets of 32-bit data buses 1201 are latched at the rise time of the clocks and the other two sets are latched at the fall of the clocks, the data transfer rate is doubled to 400 Mbps at 64 input/output bits (FIG. 13b). When the clocks that are applied to latches are further set to two phases that are phase-shifted by $\pi/2$ as shown in FIG. 13c and both the rise time and fall time of the clocks are used to realize latching of the data of four sets of 32-bit data buses at a timing of 800 MHz cycles, the data transfer rate reaches 800 Mbps at 32 input/output bits. The control signals for switching the input clocks to each latch circuit 1203 are sent from the switching control circuit, as with the control signals for switching the input/output bit configuration. In this way, changing the prefetch number to 1, 2 and 4 enables switching of not only the input/output bit configuration, but the data transfer rate as well.

What is claimed is:

1. A stacked semiconductor memory device comprising:
   a memory cell array chip that is provided with a memory cell array;
   an interface chip that is stacked with said memory cell array chip and that is provided with memory configuration switching circuits for changing the input/output bit configuration of said memory cell array; and a plurality of interchip wires for connecting said memory cell array chip and said interface chip.

2. A stacked semiconductor memory device according to claim 1, wherein:
   a plurality of memory cell array chips are stacked, and
   said memory configuration switching circuit changes the input/output bit configurations of the memory cell arrays that are provided on each of said plurality of stacked memory cell array chips.

3. A stacked semiconductor memory device according to claim 2, wherein said memory configuration switching circuit comprises:
   a plurality of switches that are provided for each group of a prescribed number of a plurality of memory units that make up a memory cell array, wherein the number of input/output bits of each memory unit group changes according to the switched state of these switches; and
   a bit switching circuit for changing the number of input/output bits of the corresponding memory unit group by switching the switched state of said plurality of switches.

4. A stacked semiconductor memory device according to claim 3, wherein said memory configuration switching circuit comprises:
   a plurality of latch circuits that are each connected to a respective one of a plurality of data buses, input and output of input/output data of the plurality of memory unit groups passing via these data buses, for latching the data in each data bus; and
   a control circuit for controlling the number of bits of input/output data and the transfer rate by controlling the latch timing in said plurality of latch circuits.

5. A stacked semiconductor memory device according to claim 4, wherein said control circuit changes the number of input/output bits of the memory unit groups by way of bit switching circuits, and implements control such that the number of input/output bits of the memory unit groups is equal to the number of bits of input/output data.

6. A stacked semiconductor memory device according to claim 5, wherein said control circuit is equipped with fuses that are provided in the wires, and according to the cut state of these fuses, generates signals for controlling the number of input/output bits of the memory unit groups, or for controlling the number of bits of input/output data and the transfer rate.

7. A stacked semiconductor memory device according to claim 5, wherein said control circuit is a logic circuit that operates in accordance with a combination of bonding option input signals, and generates signals for controlling the number of input/output bits of the memory unit groups or the number of bits of input/output data and the transfer rate.

8. A stacked semiconductor memory device according to claim 4, wherein said control circuit is equipped with fuses that are provided in the wires, and according to the cut state of these fuses, generates signals for controlling the number of input/output bits of the memory unit groups, or for controlling the number of bits of input/output data and the transfer rate.

9. A stacked semiconductor memory device according to claim 4, wherein said control circuit is a logic circuit that operates in accordance with a combination of bonding option input signals, and generates signals for controlling the number of input/output bits of the memory unit groups or the number of bits of input/output data and the transfer rate.

10. A stacked semiconductor memory device according to claim 2, wherein said stacked semiconductor memory device is DRAM.

11. A stacked semiconductor memory device according to claim 3, wherein said stacked semiconductor memory device is DRAM.

12. A stacked semiconductor memory device according to claim 1, wherein said memory configuration switching circuit comprises:
    a plurality of switches that are provided for each group of a prescribed number of a plurality of memory units that make up a memory cell array, wherein the number of input/output bits of each memory unit group changes according to the switched state of these switches; and
    a bit switching circuit for changing the number of input/output bits of the corresponding memory unit group by switching the switched state of said plurality of switches.

13. A stacked semiconductor memory device according to claim 12, wherein said memory configuration switching circuit comprises:
    a plurality of latch circuits that are each connected to a respective one of a plurality of data buses, input and output of input/output data of the plurality of memory unit groups passing via these data buses, for latching the data in each data bus; and
    a control circuit for controlling the number of bits of input/output data and the transfer rate by controlling the latch timing in said plurality of latch circuits.

14. A stacked semiconductor memory device according to claim 13, wherein said control circuit changes the number of input/output bits of the memory unit groups by way of bit switching circuits, and implements control such that the number of input/output bits of the memory unit groups is equal to the number of bits of input/output data.

15. A stacked semiconductor memory device according to claim 14, wherein said control circuit is a logic circuit that operates in accordance with a combination of bonding option input signals, and generates signals for controlling the number of input/output bits of the memory unit groups or the number of bits of input/output data and the transfer rate.

16. A stacked semiconductor memory device according to claim 14, wherein said control circuit is equipped with fuses that are provided in the wires, and according to the cut state of these fuses, generates signals for controlling the number of input/output bits of the memory unit groups, or for controlling the number of bits of input/output data and the transfer rate.

17. A stacked semiconductor memory device according to claim 13, wherein said control circuit is equipped with fuses that are provided in the wires, and according to the cut state of these fuses, generates signals for controlling the number of input/output bits of the memory unit groups, or for controlling the number of bits of input/output data and the transfer rate.

18. A stacked semiconductor memory device according to claim 13, wherein said control circuit is a logic circuit that operates in accordance with a combination of bonding option input signals, and generates signals for controlling the number of input/output bits of the memory unit groups or the number of bits of input/output data and the transfer rate.

19. A stacked semiconductor memory device according to claim 12, wherein said stacked semiconductor memory device is DRAM.

20. A stacked semiconductor memory device according to claim 1, wherein said stacked semiconductor memory device is DRAM.

* * * * *